US007123062B2

(12) United States Patent
Do

(10) Patent No.: US 7,123,062 B2
(45) Date of Patent: Oct. 17, 2006

(54) POWER-UP CIRCUIT IN SEMICONDUCTOR MEMORY DEVICE

(75) Inventor: Chang-Ho Do, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/788,549

(22) Filed: Feb. 27, 2004

(65) Prior Publication Data

US 2005/0140404 A1 Jun. 30, 2005

(30) Foreign Application Priority Data

Dec. 30, 2003 (KR) ...................... 10-2003-0099601

(51) Int. Cl.
*H03L 7/00* (2006.01)

(52) U.S. Cl. ...................................................... 327/143

(58) Field of Classification Search ................ 327/143, 327/198

See application file for complete search history.

(56) References Cited

U.S. PATENT DOCUMENTS 4,584,492 A * 4/1986 Sharp .......................... 326/70
4,633,107 A * 12/1986 Norsworthy ................ 327/143
4,902,910 A * 2/1990 Hsieh ......................... 327/143
5,345,424 A 9/1994 Landgraf
5,477,176 A 12/1995 Chang et al.
5,510,741 A 4/1996 Childs
5,557,579 A 9/1996 Raad et al.
5,629,642 A * 5/1997 Yoshimura .................. 327/142
5,889,416 A * 3/1999 Lovett ........................ 326/121
5,898,635 A 4/1999 Raad et al.
6,407,598 B1 * 6/2002 Ogane ........................ 327/143
6,549,481 B1 4/2003 McLaury
6,731,143 B1 * 5/2004 Kim ........................... 327/143
2002/0075745 A1 6/2002 McLaury
2003/0014620 A1 1/2003 Hanjani
2004/0012267 A1 1/2004 Kang
2004/0189357 A1 * 9/2004 Kang et al. ................. 327/143

FOREIGN PATENT DOCUMENTS

JP 8-321758 12/1996

* cited by examiner

*Primary Examiner*—My-Trang Nu Ton
(74) *Attorney, Agent, or Firm*—Blakely Sokoloff Taylor & Zafman

(57) ABSTRACT

A power-up circuit of a semiconductor memory device includes a power supply voltage level follower unit for providing a bias voltage which is linearly varied according to variation of a power supply voltage, a power supply voltage detection unit for detecting the variation of the power supply voltage to a predetermined critical voltage level in response to the bias voltage, and a reset prevention unit for canceling variation of the detection signal due to a power drop by delaying level transition of the detection signal according to decrease of the power supply voltage.

7 Claims, 2 Drawing Sheets

POWER-UP CIRCUIT IN SEMICONDUCTOR MEMORY DEVICE

FIELD OF THE INVENTION

The present invention relates to a semiconductor memory device; and, more particularly, to a power-up circuit in a semiconductor memory device.

DESCRIPTION OF RELATED ART

Generally, a semiconductor memory device includes various internal logics and an internal voltage generation circuit for securing stable element operation. The operations of the logics should be initialized to specific states before a normal operation. Also, the internal voltage generating circuit provides a bias voltage to the internal logics of the semiconductor memory device. If the bias voltage does not have a desired voltage level when a power supply voltage VDD is applied from an external circuit, some problems such a latch-up are caused. Therefore, it is difficult to obtain reliability of the semiconductor memory device. In order to solve the latch-up due to instabilities of the internal voltage and the initialization of the internal logics, the semiconductor memory device has a power-up circuit.

The power-up circuit is not operated in response to a voltage level of the power supply voltage VDD as soon as the power supply voltage VDD is applied in an initialization operation of the semiconductor memory device, but operated when the level of the power supply voltage VDD is increased to a critical voltage level.

A power-up signal outputted from the power-up circuit is maintained to a logic low level until the level of the power supply voltage VDD is lower than the critical voltage level by sensing voltage increase of the power supply voltage VDD applied from an external circuit, and transited to a logic high level when the level of the power supply voltage level VDD is stabilized to over the critical voltage level. In contrary, when the voltage level of the power supply voltage VDD is decreased, the power-up signal is maintained with a logic high level until the voltage level of the power supply voltage VDD is higher than the critical voltage level, and then, when the voltage level of the power supply voltage VDD is decreased under the critical voltage level, the power-up signal is transited to a logic low level.

After the power supply voltage is applied, latches included in the internal logics of the semiconductor memory device are initialized to predetermined values while the power-up signal is a logic low level, and an initialization operation of the internal voltage generation circuit is also carried out at this time.

Meanwhile, the critical voltage level of the power supply voltage VDD, which the power-up signal is transited, is to perform normal switching operations of logics. The critical voltage level is designed to be a larger than that of the threshold voltage of the MOS transistor. If the critical voltage level is designed to be the same level with the threshold voltage of the MOS transistor, there is no problem to initialize digital logics. However, in an internal power circuit configured with an analog circuit, e.g., boosted voltage (VPP) generator, since an operation efficiency is decreased, a latch-up may be caused after a power-up trigger. Therefore, the critical voltage level is designed to be larger than the threshold voltage of the MOS transistor to stably operate the analog circuit after the power-up trigger.

FIG. 1 is a circuit diagram showing a conventional power-up circuit in a semiconductor memory device.

As shown, the conventional power-up circuit includes a power voltage level follower unit 100, a power voltage trigger unit 110 and a buffer unit 120.

The power voltage level follower unit 100 provides a bias voltage Va which increases or decreases linearly in proportion to a power voltage VDD. The power voltage trigger unit 110 serves to detect that a voltage level of the power voltage VDD becomes a critical voltage level in response to the bias voltage Va. The buffer unit 120 generates a power-up signal pwrup by buffering a detection bar signal detb outputted from the power voltage trigger unit 110.

Herein, the voltage level follower unit 100 is provided with a first resistor R1 and a second resistor R2 connected between the power voltage VDD and a ground voltage VSS for a voltage division.

The power voltage trigger unit 110 includes a P-channel metal oxide semiconductor (PMOS) transistor MP0, an N-channel metal oxide semiconductor (NMOS) transistor MN0 and a first inverter INV0.

The PMOS transistor MP0 is connected between the power voltage VDD and a node N1 and its gate is connected to the ground voltage VSS. The NMOS transistor MN0 is connected between the ground voltage VSS and the node N1 and its gate is connected to the bias voltage Va. The first inverter INV0 receives a detect signal det from the node N1 to output the detection bar signal detb. Herein, the PMOS transistor MP0 can be replaced with another load element having the same valid resistance as that of the PMOS transistor MP0.

Meanwhile, the buffering unit 120 is provided with a plurality of inverters INV1 to INV4 for receiving the detection bar signal debt to output the power-up signal pwrup.

FIG. 2 is a timing diagram showing an operation of the conventional power-up circuit shown in FIG. 1.

The bias voltage Va outputted from the power voltage level follower unit 100 is varied as a following equation 1:

$$Va = \frac{R2}{R1 + R2} \times VDD \qquad \text{Eq. 1}$$

That is, the bias voltage Va is increased as the voltage level of the power voltage VDD is increased. If the bias voltage Va is increased to be higher than a threshold voltage of the NMOS transistor MN0, the NMOS transistor MN0 is turned on and the detect signal det is changed depending on currents flown on the PMOS transistor MP0 and the NMOS transistor MN0.

At an initial state, the detection signal det is increased following the power voltage VDD. Thereafter, as the bias voltage Va is increased, the NMOS transistor MN0 has an increased current flow and the detection signal det is changed to a logic low level at a predetermined voltage level of the power supply voltage VDD. At this time, when the voltage level of the detection signal det crosses a logic threshold value of the first inverter INV0, a voltage level of the detection bar signal detb is increased following the power supply voltage VDD. The detection bar signal detb outputted from the first inverter INV0 is buffered in the buffer unit 120 and outputted as the power-up signal pwrup having a logic high level.

However, after the power supply voltage is stabilized, a power drop can be occurred by a power noise, current consumption due to a temporary operation of the device, current consumption of a resistor or the like. In a trend that an operation voltage of the semiconductor memory device is decreased, since the conventional power-up circuit detects an abnormal falling of the voltage level, a reset operation abnormally operated by the power-up signal pwrup can not be prevented. Thereafter, even if the power up signal returns to a logic high level as the power-up signal pwrup is recovered to a previous voltage level, an abnormal reset may cause an unstable operation of a semiconductor memory device.

SUMMARY OF THE INVENTION

It is, therefore, an object of the present invention to provide a power-up circuit in a semiconductor memory device capable of preventing an abnormal reset operation due to a power drop.

In accordance with an aspect of the present invention, there is provided a power-up circuit of a semiconductor memory device, including: a power supply voltage level follower unit for providing a bias voltage which is linearly varied according to variation of a power supply voltage; a power supply voltage detection unit for detecting the variation of the power supply voltage to a predetermined critical voltage level in response to the bias voltage; and a reset prevention unit for canceling variation of the detection signal due to a power drop by delaying level transition of the detection signal according to decrease of the power supply voltage.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a power-up circuit in a semiconductor memory device according to the present invention will be described in detail referring to the accompanying drawings.

Figure 3:
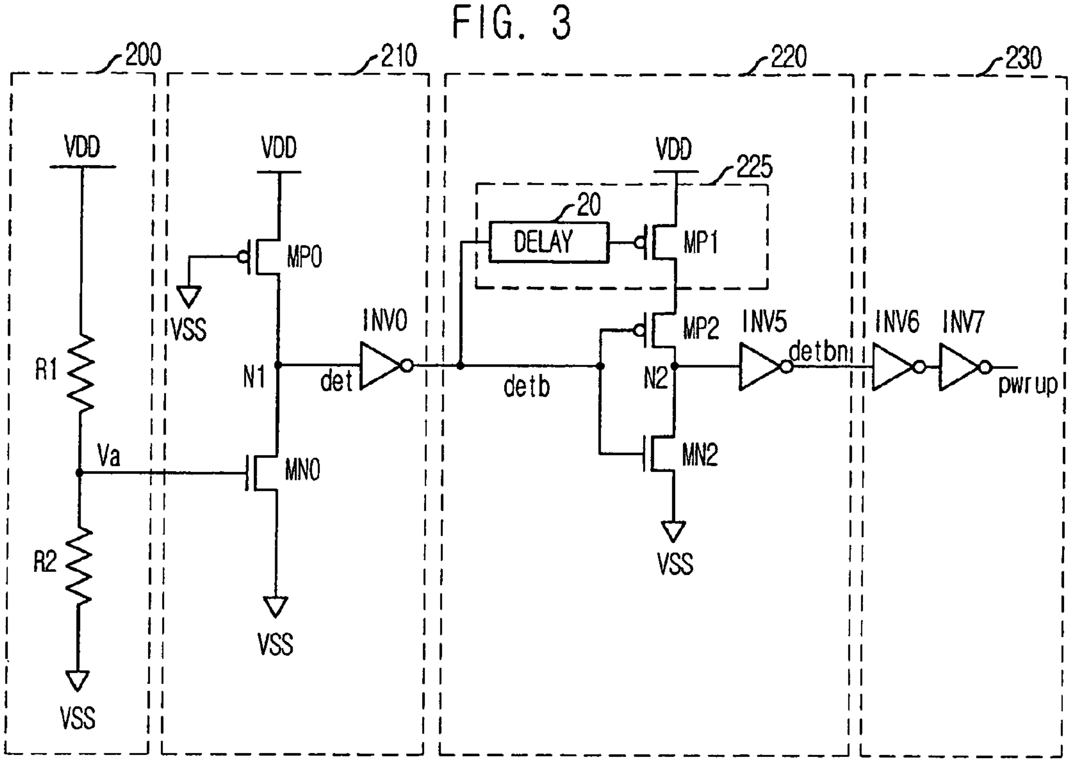
FIG. 3 is a circuit diagram illustrating a power-up circuit in accordance with the preferred embodiment of the present invention.

FIG. 3 is a circuit diagram illustrating a power-up circuit in accordance with the preferred embodiment of the present invention.

As shown, the power-up circuit includes a power supply voltage level follower unit 200, a power supply voltage detection unit 210, a reset prevention unit 220 and a buffer unit 230. The power supply voltage level follower unit 200 provides a bias voltage Va, which is linearly varied according to a voltage level of the power supply voltage VDD, by using the power supply voltage VDD and a ground voltage VSS. The power supply voltage detection unit 210 detects whether the power supply voltage VDD is transited to a predetermined critical voltage level in response to the bias voltage Va. The reset prevention unit 220 cancels variation of a detection signal, which is outputted from the power supply voltage detection unit 210, due to a power drop by delaying a transition of the detection signal to a logic low level. The buffer unit 230 outputs a power-up signal pwrup by buffering an output signal detbn of the reset prevention unit 220.

The power supply voltage level follower unit 200 is provided between a power supply voltage VDDD and a ground voltage VSS and includes a first resistor and a second resistor R1 and R2. Also, the first and second resistors R1 and R2 can be configured with an active resistor such a MOS transistor.

The power supply voltage detection unit 210 includes a PMOS transistor MP0 whose gate is connected to the ground voltage VSS, an NMOS transistor MN0 whose gate receives the bias voltage Va, and an inverter INV0. The PMOS transistor MP0 is connected between the power supply voltage VDD and a first node N1 and the the NMOS transistor MN0 is connected between the first node N1 and the ground voltage VSS. The inverter receives the detection signal det outputted from the first node N1. Also, the PMOS transistor MP0 can be replace with another load element having the same effective resistance with that of the PMOS transistor MP0.

Figure 1:
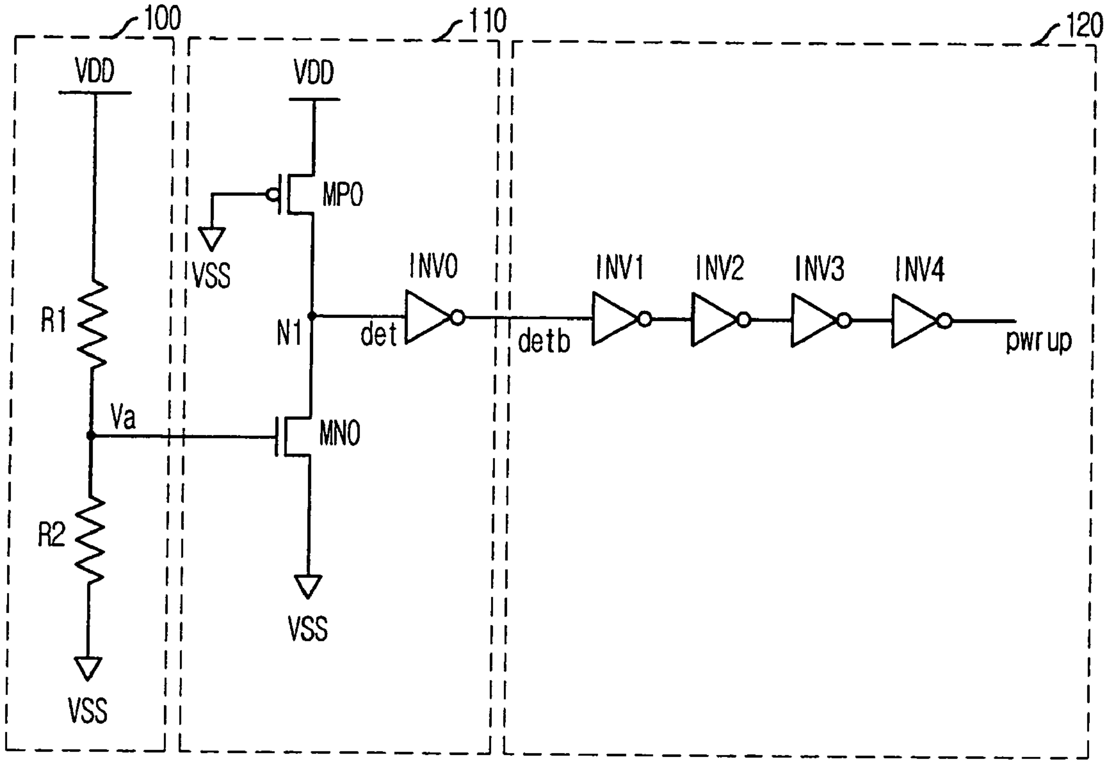
FIG. 1 (PRIOR ART)
FIG. 1 is a circuit diagram showing a conventional power-up circuit in a semiconductor memory device.
Figure 2:
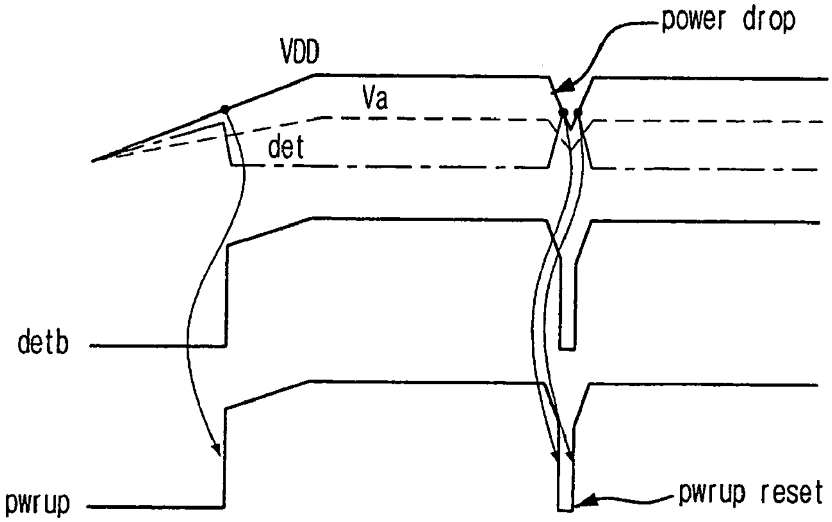
FIG. 2 (PRIOR ART)
FIG. 2 is a timing diagram showing an operation of the conventional power-up circuit shown in FIG. 1.

As described in the above, the power supply follower unit 200 and the power supply voltage detection unit 210 of the power-up circuit in accordance with the present invention are identically configured with those of the power-up circuit illustrated in FIG. 1. Therefore, the reference numerals in FIG. 3 are identically used for the same elements in FIG. 1.

The reset prevention unit 220 includes pull-up and pull-down transistors MP2 and MN2 whose gates receive an output signal debt of the power supply voltage detection unit 210, a response delay unit 225 for delaying a pull-up operation of the pull-up PMOS transistor MP2 in response to transition of the output signal debt of the power supply voltage detection unit 210, and an inverter connected to the pull-up and pull-down transistors MP2 and MN2. The response delay unit 255 includes a delay 20 for delaying the output signal debt of the power supply voltage detection unit 210 as much as a predetermined time and a MPOS transistor MP1 which is connected between the power supply voltage VDD and the pull-up PMOS transistor MP2 and whose gate receives an output signal of the delay 20. The delay 20 can be also replaced with a general delay element such as a resistor, capacitor or the like.

The buffer unit 230 is configured with an inverter chain constituted with two inverters INV6 and INV7. The buffer unit 230 receives an output signal detbn of the reset prevention unit 220.

Figure 4:
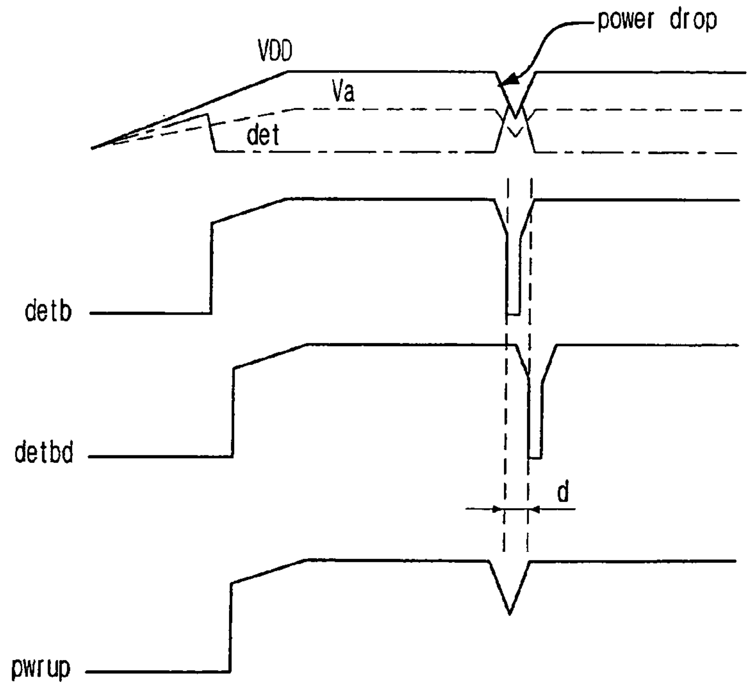
FIG. 4 is a timing diagram showing an operation of the power-up circuit of FIG. 3 in accordance with the present invention.

FIG. 4 is a timing diagram showing an operation of the power-up circuit of FIG. 3 in accordance with the present invention.

As shown, a bias voltage Va level is increased as the power supply voltage VDD is increased after applying the power supply voltage VDD. If the bias voltage Va level is increased to over a threshold voltage level of the NMOS transistor MN0 in the power supply detection unit 210, the NMOS transistor is turned on, so that a voltage level of the detection signal is varied according to current flows in the PMOS transistor, which acts as a load, and the NMOS transistor MN0.

Since the NMOS transistor MN0 is turned on at an initial stage, a voltage level of the detection signal det is increased according to increase of the power supply voltage VDD level. As the bias voltage Va level is increased, since a current drivability of the NMOS transistor is increased, the voltage level of the detection signal det is transited to a logic low level at a specific level of the power supply voltage level VDD. At this time, if the voltage level of the detection signal det becomes over a logic threshold level of the inverter INV0, the output signal debt of the inverter INV0 is increased according to the increase of the power supply voltage VDD.

When the output signal debt of the power supply voltage detection unit 210 becomes a logic high level, the pull-down NMOS transistor MN2 of the reset prevention unit 220 is turned on to thereby discharge a second node N2, and the output signal detbn of the inverter INV5 becomes a logic high level. Thereafter, the output signal detbn makes that a power-up signal pwrup is transited to a logic high level by being buffered in the buffer unit 230.

In the above procedure, an operation of the power-up circuit in accordance with the present invention is mostly identical to that of the conventional power-up circuit in FIG. 1.

As described in the prior art, when the power drop is occurred, the power supply voltage detection unit 210 detects the drop of the power supply voltage VDD level, so that the voltage level of the detection signal det is increased and the output signal debt of the inverter INV0 is pulsed to a logic low level. If the output signal debt of the INV0 is pulsed to a logic low level, the pull-up PMOS transistor MP2 is turned on and the pull-down transistor MN2 is turned off.

However, the pull-up operation of the pull-up PMOS transistor MP2 can be performed only when the PMOS transistor MP1 of the response delay unit 225 is turned on. Since the PMOS transistor MP1 of the response delay unit 225 receives not the output signal debt of the inverter INV0 but a delayed output signal detb of the inverter INV0 as a gate input, the PMOS transistor MP1 is turned on after the predetermined delay 20 since the output signal detb of the inverter INV0 is pulsed to a logic low level.

If a delay time of the delay 20 is configured to have longer time than a time that the output signal detb is maintained to a logic low level, the pull-up operation is not carried out by the PMOS transistors MP1 and MP2. Therefore, even if the power-up signal pwrup is temporarily decreased, the power-up signal pwrup is not transited to a logic low level.

Accordingly, even though the power drop is occurred after the power-up signal pwrup is transited to a logic high level, undesired initialization operations of internal logics can be prevented by the power-up circuit in accordance with the present invention. Therefore, malfunctions of the semiconductor memory device due to the undesired initialization operation can be prevented.

In accordance with the preferred embodiment of the present invention, the reset prevention unit 220 is configured to a pull-up side. However, the response delay unit 225 can be arrayed at a pull-down side according to a characteristic of the detection signal det.

While the present invention has been described with respect to the particular embodiments, it will be apparent to those skilled in the art that various changes and modifications may be made without departing from the spirit and scope of the invention as defined in the following claims.

What is claimed is:

1. A power initialization circuit for a semiconductor memory device, comprising:

a power supply voltage level follower unit to provide a bias voltage which varies linearly with a power supply voltage;

a power supply voltage detection unit to detect when a level of the power supply voltage reaches a predetermined level to thereby generate a detection signal; and a reset prevention unit to generate a power-up signal to thereby prevent a logic level of the power-up signal from transitioning during a power drop of the power supply voltage having a duration less than or equal to a predetetermined period, wherein the reset prevention unit includes:

a first pull-up means and a first pull-down means controlled by the detection signal;

a delay unit for delaying the detection signal by a predetermined time; and a second pull-up means connected between the first pull-up means and a power supply voltage, and controlled by an output signal of the delay unit, wherein the power supply voltage detection unit includes:

a load element connected between the power supply voltage and a first node;

an NMOS transistor which is connected between a ground voltage and the first node and whose gate receives the bias voltage; and an inverter, which is connected to the first node, for outputting the detection signal.

2. The power initialization circuit as recited in claim 1, further comprising a buffer unit for outputting the power-up signal by buffering an output signal of the reset prevention unit.

3. The power initialization circuit as recited in claim 2, wherein the buffer unit includes an inverter chain receiving the output signal of the reset prevention unit.

4. The power initialization circuit as recited in claim 1, wherein the reset prevention unit further includes an inverter connected to the first pull-up means and the first pull-down means.

5. The power initialization circuit as recited in claim 1, wherein each of the first and the second pull-up devices is a PMOS transistor, and the pull-down means is an NMOS transistor.

6. The power initialization circuit as recited in claim 1, wherein the power supply voltage level follower unit is provided between the power supply voltage and a ground voltage, and includes a first and a second load element configured as a voltage divider.

7. The power initialization circuit as recited in claim 1, wherein the load element is a PMOS transistor which is connected between the power supply voltage and the first node and whose gate is connected to the ground voltage.

* * * * *